(12) United States Patent
Toumiya et al.

(10) Patent No.: US 8,743,265 B2
(45) Date of Patent: Jun. 3, 2014

(54) SOLID-STATE IMAGING DEVICE WITH LENS, METHOD OF MANUFACTURING SOLID-STATE IMAGING DEVICE WITH LENS, AND ELECTRONIC APPARATUS

(75) Inventors: Yoshinori Toumiya, Kumamoto (JP); Yoichi Ootsuka, Kumamoto (JP)

(73) Assignee: Sony Corporation (JP)

( * ) Notice: Subject to any disclaimer, the term of this patent is extended or adjusted under 35 U.S.C. 154(b) by 6 days.

(21) Appl. No.: 13/416,580

(22) Filed: Mar. 9, 2012

(65) Prior Publication Data
US 2012/0242873 A1 Sep. 27, 2012

(30) Foreign Application Priority Data

Mar. 23, 2011 (JP) ................... 2011-064301

(51) Int. Cl.
*H04N 5/225* (2006.01)
*H04N 5/335* (2011.01)

(52) U.S. Cl.
USPC ........................................ 348/340; 348/294

(58) Field of Classification Search
USPC ........................ 348/294–308, 330, 340, 302; 257/291–292, 432–466, 127
See application file for complete search history.

(56) References Cited

U.S. PATENT DOCUMENTS

| 7,262,072 B2 * | 8/2007 | Kim ................................. 438/57 |
| 2004/0012707 A1 * | 1/2004 | Fukusho et al. ............... 348/340 |
| 2008/0315339 A1 * | 12/2008 | Rennie ........................... 257/432 |
| 2009/0197366 A1 * | 8/2009 | Sakoh et al. ..................... 438/70 |
| 2009/0256225 A1 * | 10/2009 | Nakai et al. .................... 257/432 |

FOREIGN PATENT DOCUMENTS

| JP | 04-233759 | 8/1992 |
| JP | 2009-224361 | 10/2009 |

* cited by examiner

*Primary Examiner* — Tuan Ho
*Assistant Examiner* — Selam Gebriel
(74) *Attorney, Agent, or Firm* — Sheridan Ross P.C.

(57) ABSTRACT

A solid-state imaging device includes a pixel that has a photoelectric conversion section which converts incident light into an electric signal; a color filter which is formed corresponding to the pixel; a micro lens which focuses the incident light to the photoelectric conversion section via the color filter; and an in-layer lens which is formed between the color filter and the micro lens and has a refractive index smaller than that of the micro lens.

10 Claims, 12 Drawing Sheets

SOLID-STATE IMAGING DEVICE WITH LENS, METHOD OF MANUFACTURING SOLID-STATE IMAGING DEVICE WITH LENS, AND ELECTRONIC APPARATUS

BACKGROUND

The present disclosure relates to a solid-state imaging device, a method of manufacturing the solid-state imaging device, and an electronic apparatus.

In the related art, as the solid-state imaging device used in digital cameras and video cameras, there are a CCD type solid-state imaging device and a CMOS type solid-state imaging device. The solid-state imaging device images an imaging target by sensing light focused by a micro lens by a light sensing section through a color filter.

In recent years, for example, along with a reduction in size of an apparatus such as a digital camera, and a mobile phone on which the solid-state imaging device are mounted, there is a demand for a reduction in size and an increase in pixels of the solid-state imaging device. However, there is a problem in that, when reducing the size and increasing the pixels of the solid-state imaging device, the distance between the light sensing section and the micro lens is shortened, incident light to the light sensing section is reduced, and thus, sensitivity of the solid-state imaging device declines.

Thus, there is a method of increasing the incident light to the light sensing section by providing a plurality of lenses to change a focal position of the incident light, thereby improving sensitivity of the solid-state imaging device (for example, see Japanese Unexamined Patent Application Publication Nos. 04-233759 and 2009-224361).

SUMMARY

Methods described in Japanese Unexamined Patent Application Publication Nos. 04-233759 and 2009-224361 consider light that is incident to the light sensing section, but does not consider light that is incident to a color filter.

When a size of the solid-state imaging device is reduced and a distance between the light sensing section and the micro lens is shortened, the focal distance of the micro lens is shortened, and a distance between the color filter and the light sensing section is also shortened. For this reason, the focal position of the incident light is moved to the color filter side.

A plurality of dyes and pigments are added to the color filter so as to have particular spectral characteristics. For this reason, when the focal position of the incident light is moved to the color filter side as mentioned above and thus the focused light is incident to the color filter, image quality degradation such as image roughness is generated by an influence of particles of dyes and pigments contained in the color filter.

It is desirable to provide a solid-state imaging device that is able to suppress the image quality degradation and a method of manufacturing the same.

Furthermore, it is desirable to provide an electronic apparatus that includes the solid-state imaging device.

According to an embodiment of the present disclosure, there is provided a solid-state imaging device that includes a pixel which has a photoelectric conversion section which converts incident light into an electric signal, a color filter which is formed corresponding to the pixel, a micro lens which focuses the incident light to the photoelectric conversion section via the color filter, and an in-layer lens which is formed between the color filter and the micro lens and has refractive index smaller than that of the micro lens.

In the solid-state imaging device according to the embodiment of the present disclosure, the in-layer lens having the refractive index smaller than that of the micro lens is included between the color filter and the micro lens. For this reason, light focused by the micro lens is emitted by the in-layer lens and is incident to the color filter.

Furthermore, according to another embodiment of the present disclosure, there is provided a method of manufacturing the solid-state imaging device which includes forming pixels having a photoelectric conversion section which converts incident light into an electric signal, forming a color filter which is formed corresponding to the pixels, forming a micro lens which focuses the incident light to the photoelectric conversion section via the color filter, and forming an in-layer lens of an n-th layer (n≥1) which is formed between the color filter and the micro lens and has refractive index smaller than that of the micro lens.

An electronic apparatus according to still another embodiment of the present disclosure has the solid-state imaging device mentioned above, an optical lens, and a signal processing circuit.

According to the embodiments of the present disclosure, it is possible to suppress an image quality degradation of the solid-state imaging device and the electronic apparatus including the solid-state imaging device.

DETAILED DESCRIPTION OF EMBODIMENTS

First Embodiment

Figure 1:
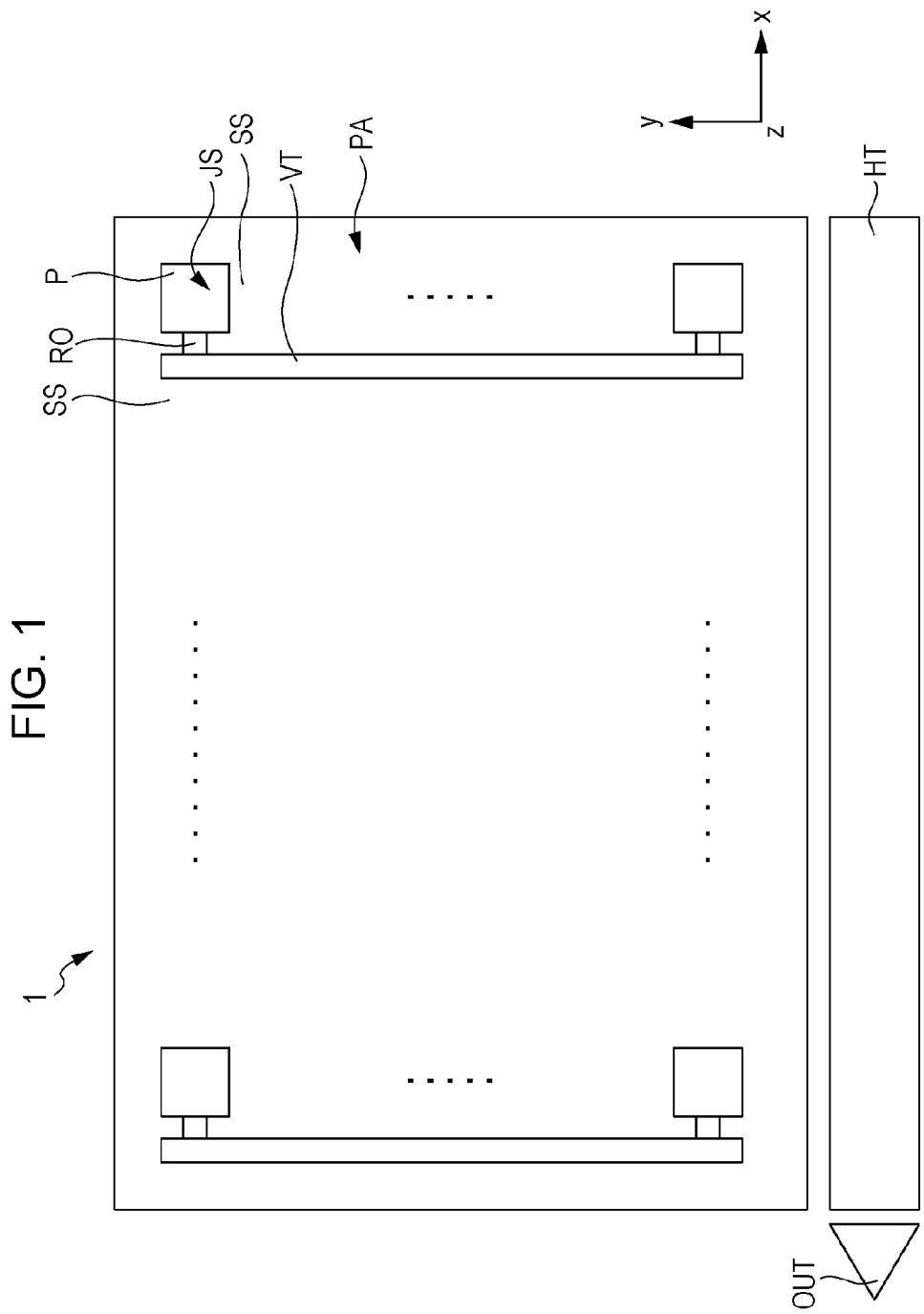
FIG. 1 is a diagram showing a solid-state imaging device according to a first embodiment of the present disclosure.

FIG. 1 is a schematic configuration diagram that shows an example of a solid-state imaging device according to a first embodiment of the present disclosure. The solid-state imaging device 1 shown in FIG. 1 is, for example, a CCD type image sensor of an interline style, and images a subject image by an imaging region PA. A pixel P, an electric charge reading section RO, and a vertical transmission resister section VT are formed in the imaging region PA.

A plurality of pixels P is provided in the imaging region PA, and the plurality of pixels P is placed so as to be aligned in a horizontal direction x and a vertical direction y in a matrix shape. The pixels P includes, for example, a photoelectric conversion element such as a photodiode, and senses light by a light sensing surface JS to generate a signal charge. An element separation section SS is provided around the plurality of pixels P so as to separate the pixels P adjacent to each other. The pixels P generate the signal charge by sensing light by the subject image by the light sensing surface JS to perform the photoelectric conversion.

A plurality of electric charge reading sections RO is provided in the imaging region PA so as to correspond to the plurality of pixels P. The electric charge reading sections RO read the signal charge generated by the pixels P to the vertical transmission register section VT.

The vertical transmission register sections VT are extended in the vertical direction y so as to correspond to the plurality of pixels P aligned in the vertical direction y in the imaging region PA. The vertical transmission register sections VT are placed between columns of the pixels P aligned in the vertical direction y. The vertical transmission register sections VT are provided in the plurality of imaging regions PA and are aligned in the horizontal direction x so as to correspond to each of the plurality of pixels P aligned in the horizontal direction x.

The vertical transmission register sections VT are so-called vertical transmissions CCD, read the signal charge from the pixel P, and sequentially transmit the signal charge in the vertical direction y via the electric charge connection section RO. The vertical transmission register sections VT has a plurality of transmission electrodes (not shown) placed so as to be aligned in the vertical direction y. The vertical transmission register sections VT sequentially transmit the signal charge, for example, by supplying a four-phase driving pulse signal to the transmission electrode in order. That is, the vertical transmission register sections VT are provided for each column of the pixels P aligned in the vertical direction y of the plurality of pixels P, and have a transmission channel region, which transmits the signal charge generated by each pixel P in the vertical direction y, on an imaging surface.

A horizontal transmission register section HT is placed in a lower end portion of the imaging region PA. The horizontal transmission register section HT is extended in the horizontal direction x, and sequentially transmits the signal charge received from the plurality of vertical transmission register section VT in the horizontal direction x. The horizontal transmission register section HT is a so-called horizontal transmission CCD, is driven by, for example, a two-phase driving pulse signal, and transmits the signal charge received from the vertical transmission register sections VT to an output section OUT for one horizontal line (pixel of one column).

The output section OUT is formed at a left end portion of the horizontal transmission register section HT. The output section OUT converts the signal charge received from the horizontal transmission register section HT into voltage, and outputs the same as an analog image signal.

Figure 2:
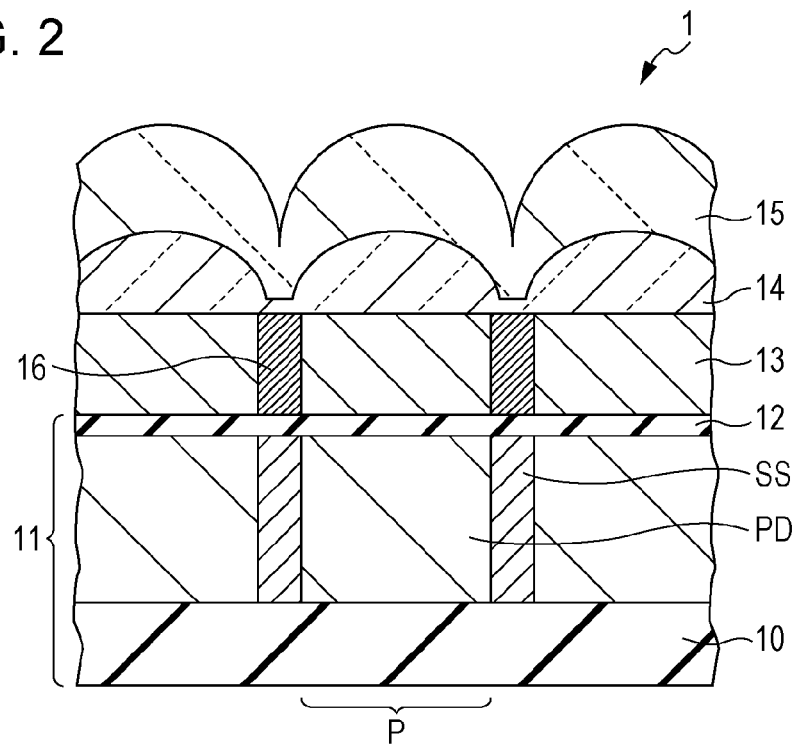
FIG. 2 is a cross-sectional view of the solid-state imaging device according to the first embodiment of the present disclosure.

Next, details of the solid-state imaging device 1 will be described by the use of FIG. 2. FIG. 2 is a cross-sectional view of the pixel P of the solid-state imaging device 1.

The solid-state imaging device 1 of the present embodiment includes a substrate 11, a wiring layer 10 formed at a surface side of the substrate 11, an insulation film 12 formed at a back side of the substrate 11, a color filter 13, a micro lens 15, and an in-layer lens 14.

The substrate 11 is a semiconductor substrate formed of silicon. The substrate 11 is formed with pixels P having a photoelectric conversion element PD, and an element separation section SS which separates each pixel P.

The photoelectric conversion section PD is, for example, a photodiode. The signal charge depending on a light sensing amount of the incident light is generated and accumulated in the photoelectric conversion element PD. The wiring layer 10 is formed at the surface side of the substrate 11, and has a wiring (not shown) which is stacked on the multi-layers via an interlayer insulating film (not shown).

The color filter 13 is formed at the back side of the substrate 11, and, for example, has a first hue filter component, a second hue filter component, and a third hue filter component for each pixel P. In the description as below, the first hue filter component, the second hue filter component, and the third hue filter component are referred to as a green filter component, a red filter component, and a blue filter component, respectively. However, an arbitrary color filter component can be adopted without being limited thereto. Furthermore, in addition to the color filter component, for example, it is also possible to use a transparent resin through which visible light is transmitted, and a filter component which attenuates the visible light such as an ND filter formed by adding a carbon black coloring matter in the transparent resin.

A desired wavelength of light is transmitted through the color filter 13, and the transmitted light is incident to the photoelectric conversion element PD in the substrate 11.

A light shielding film 16 is provided between the respective color filter components of the color filter 13. The light shielding film 16 is provided so as to prevent a mixed color generated by the leakage of incident light to the adjacent photoelectric conversion element PD.

The micro lens 15 is a convex lens that is formed on a surface of an opposite side of the substrate 11 side of the color filter 13. The micro lens 15 focuses the incident light to the photoelectric conversion element PD via one of the respective color filter components of the color filter 13.

The in-layer lens 14 is a convex lens that is formed between the micro lens 15 and the color filter 13. A refractive index $n_2$ of the in-layer lens 14 is smaller than a refractive index $n_1$ of the micro lens 15 ($n_1 > n_2$). The in-layer lens 14 emits light focused by the micro lens 15 as described below.

Materials constituting the micro lens 15 and the in-layer lens 14 include, for example, inorganic materials such as SiN and SiON. The refractive index of SiN is about 1.9 to 2.0, and the refractive index of SiON is about 1.45 to 1.9.

Furthermore, materials constituting the micro lens 15 and the in-layer lens 14 include organic materials such as styrene resin, acrylic resin, styrene acryl copolymer resin, and siloxane resin. The refractive index of the styrene resin is about 1.6, and the refractive index of the acrylic resin is about 1.5.

The refractive index of styrene acryl copolymer resin is about 1.5 to 1.6, and the refractive index of siloxane resin is about 1.45. Acrylic resin and the siloxane resin may be added with fluorine and hollow silica so as to lower the value of n. The refractive index of n is about 1.2 to 1.45.

Furthermore, as the materials constituting the micro lens 15 and the in-layer lens 14, for example, resin mentioned above as an organic material, and organic and inorganic hybrid materials with TiO particulates dispersed into polyimide resin may be used.

Since the TiO particulates are materials prone to cause a photocatalytic reaction, when dispersing the TiO particulates into the resin, it is common to cover the periphery of the TiO particulates by a coating film so as to suppress the photocatalytic reaction. When using the material of the organic and inorganic hybrid with the TiO particulates dispersed as the in-layer lens 14, the coating film covering the periphery of the TiO particulates is taken by the etching of the manufacturing process, whereby the TiO particulates are exposed. When the TiO particulates are exposed, the spectral characteristics of the solid-state imaging device 1 are degraded by the photocatalytic reaction of the TiO particulates. Thus, in the case of using the material of the organic and inorganic hybrid with the TiO particulates dispersed as the in-layer lens 14, it is desirable to use SiN, nitride or the like as the material of the micro lens 15 in order to suppress the photocatalytic reaction of the exposed TiO particulates.

For example, the refractive index of the in-layer lens 14 may be set to be smaller than that of the micro lens 15 by changing the materials used in each lens, such as using SiON as the material of the micro lens 15, and using SiN as the material as the in-layer lens 14. Otherwise, the refractive index may be changed by changing the refractive indexes of the micro lens 15 and the in-layer lens 14. Otherwise, the refractive index may be changed by making a lens diameter of the in-layer lens 14 smaller than that of the micro lens 15.

In addition, although it is not shown, a barrier metal may be provided between the light shielding film and the insulating film 12. Furthermore, the insulation film 12 may be omitted, and the color filter 13 may be formed on the substrate 11.

Figure 3:
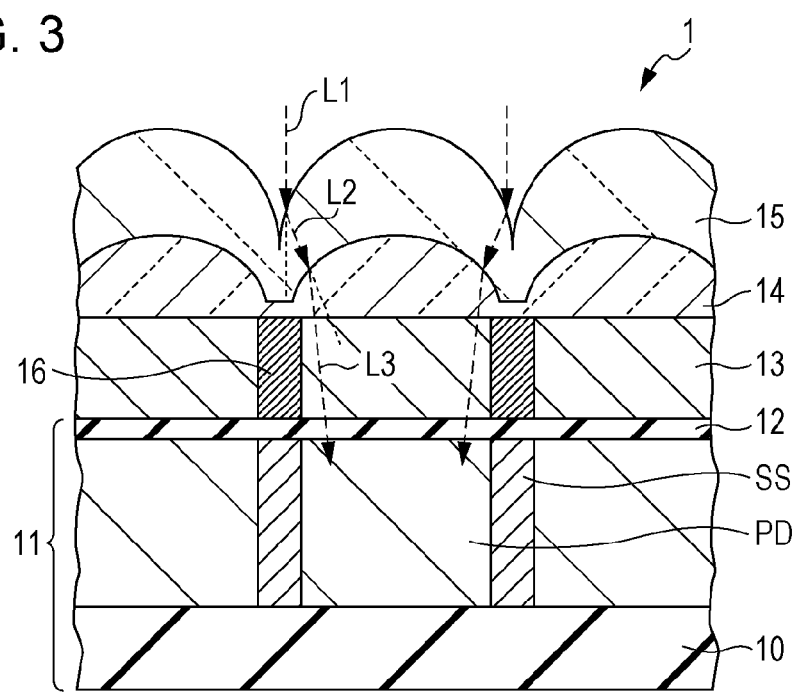
FIG. 3 is a cross-sectional view of the solid-state imaging device according to the first embodiment of the present disclosure.

Light incident to the solid-state imaging device 1 according to the present embodiment will be described by the use of FIG. 3.

The incident light L1 is firstly incident to the micro lens 15. The incident light L1 becomes light L2 refracted to the center of the inside, that is, near the center of the micro lens 15, by the micro lens 15 of the refractive index n1. That is, the incident light L1 is focused by the micro lens 15.

Light L2 focused by the micro lens 15 is incident to the in-layer lens 14. The light L2 becomes light L3 refracted to the outside, that is, to the outer periphery of the in-layer lens 14, by the in-layer lens 14 of the refractive index n2. That is, the light L2 is emitted by the in-layer lens 14.

Light L3 incident to the color filter 13 is emitted by the in-layer lens 14. Thus, the light L3 incident to the color filter 13 is able to be transmitted through a wide area of the color filter 13 and reach the photoelectric conversion element PD.

The light L2 focused by the micro lens 15 is incident to the in-layer lens 14. As mentioned above, as a method of making the refractive indexes of the in-layer lens 14 and the micro lens 15 different from each other, there is a method of making the lens diameter of the in-layer lens 14 smaller than that of the micro lens 15. In this case, since it is possible to relatively make the lens diameter of the micro lens 15 greater than that of the in-layer lens 14, the micro lens 15 is able to focus more incident light.

A method of manufacturing the solid-state imaging device 1 according to the present embodiment will be described by the use of FIGS. 4A to 4E. In addition, since a process of forming the pixel P and a process of forming the color filter 13 are identical to the related art, the descriptions thereof will be omitted.

Figure 4A:
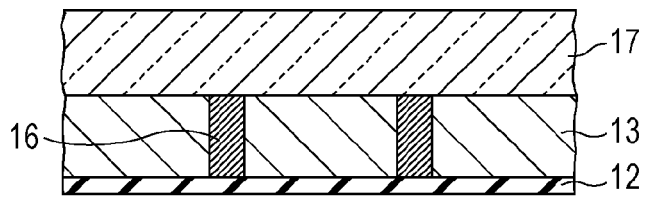
FIGS. 4A to 4E are manufacturing process diagrams of the solid-state imaging device according to the first embodiment of the present disclosure.

Firstly, an in-layer lens material 17 is formed on the color filter 13 (FIG. 4A). As the in-layer lens material 17, an organic material, an inorganic material, an organic and inorganic hybrid material or the like mentioned above are used.

Figure 4B:
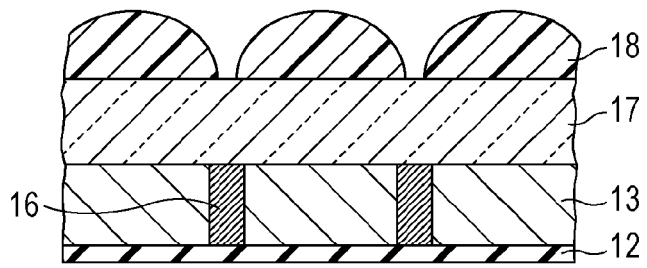

A positive type photoresist 18 is applied onto the in-layer lens material 17. As the positive type photoresist 18, for example, novolac resin is used as a main ingredient. Next, the positive type photoresist 18 is patterned corresponding to each pixel by the use of a photolithography method. The patterned positive type photoresist 18 is subjected to a heat treatment at a temperature higher than a thermal softening point, thereby forming a lens-shaped positive type photoresist 18 (FIG. 4B).

Figure 4C:
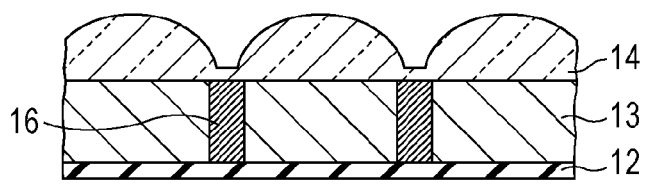

The lens-shaped positive type photoresist 18 is used as a mask, and the lens shape is pattern-transferred to the underlying in-layer lens material 17 by the use of the dry etching method, thereby forming the in-layer lens 14 (FIG. 4C).

Figure 4D:
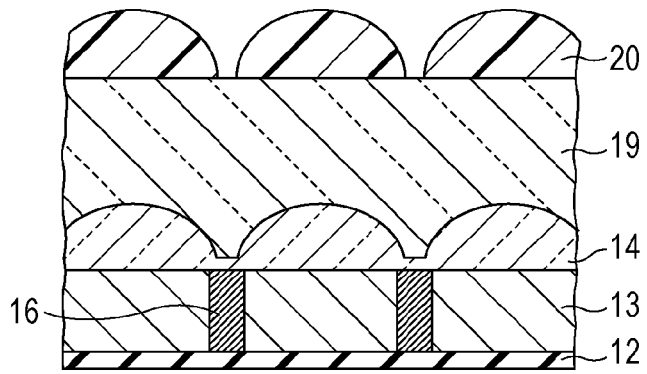

Next, a micro lens material 19 is formed on the in-layer lens 14, and a lens-shaped positive type photoresist 20 is formed by the same process as the positive type photoresist 18 (FIG. 4D).

Figure 4E:
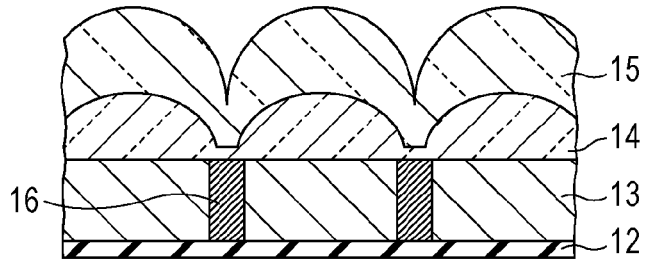

The positive type photoresist 20 is used as a mask, and the lens shape is pattern-transferred to the underlying micro lens material 19 by the use of the dry etching method, thereby forming the micro lens 15. At this time, in the solid-state imaging device 1 according to the present embodiment, in order to remove a gap between the adjacent lenses, the etching is consecutively performed (FIG. 4E).

As a method of making the refractive indexes of the in-layer lens 14 and the micro lens 15 different from each other, when the lens diameter of the in-layer lens 14 is smaller than that of the micro lens 15, for example, the etching may not continued but the gap between the adjacent lenses may be left in the in-layer lens 14, and the etching may be continued and the gap between the adjacent lenses may be removed in the micro lens 15, thereby making the lens diameter of the micro lens 15 greater than that of the in-layer lens 14.

Additionally, in addition to the method of manufacturing the lenses (the in-layer lens 14 and the micro lens 15) mentioned above, it may be possible to use a method of performing the heat treatment at a temperature equal to or greater than the thermal softening temperature of the photosensitive resin after sequentially performing a film formation, a prebake, an exposure, a development, a bleaching exposure treatment of the lens material formed of the photosensitive resin.

As described above, according to the solid-state imaging device 1 according to the first embodiment, by providing the in-layer lens 14 of the refractive index smaller than that of the micro lens 15 between the color filter 13 and the micro lens 15, it is possible to emit the light L3 incident to the color filter 13. As a result, it is possible to suppress the image quality degradation due to the influence of the pigment and dye particles contained in the color filter 13.

Particularly, when a focus of the lens is present in the color filter 13, the focus of incident light is matched with the pigment particle of the color filter 13, whereby the image quality degradation such as image roughness is generated. However, in the solid-state imaging device 1 according to the present embodiment, since the light L3 incident to the color filter 13 can be emitted, it is possible to suppress the image quality degradation such as the image roughness.

Furthermore, by making the refractive index of the in-layer lens 14 smaller than the micro lens 15 compared to a case where the refractive index of the in-layer lens 14 is greater than that of the micro lens 15 to further focus light by the micro lens 14, it is possible to increase the volume of the light L3 passing through the color filter 13, and thus, the color film 13 can be thinned. As a result, it is possible to realize thinning, an increase in oblique light sensitivity of the solid-state imaging device 1, and an improvement in shading characteristics.

MODIFIED EXAMPLE 1

Next, a solid-state imaging device 2 according to a modified example 1 of the first embodiment will be described by the use of FIG. 5.

The solid-state imaging device 2 is different from the solid-state imaging device 1 shown in FIG. 2 in that the solid-state imaging device 2 has a planarization film 21 between the insulating film 12 and the color filter 13.

As the planarization film 21, for example, a nitride film, an oxide film or the like are used. The planarization film 21 is formed on the same plane as that of the light shielding film 16 after forming the light shielding film 16.

In this manner, the color filter 13 is not directly formed on the insulating film 12, but the color filter 13 may be formed after the planarization by the planarization film 21.

Second Embodiment

Next, a solid-state imaging device 3 according to a second embodiment of the present disclosure will be described with reference to FIGS. 6 to 8E. The solid-state imaging device 3 according to the present embodiment has the same configuration as that of the solid-state imaging device 1 shown in FIG. 2 except that an in-layer lens 34 is a concave lens, and thus, the same reference numerals are denoted and the repeated description will be omitted.

Figure 6:
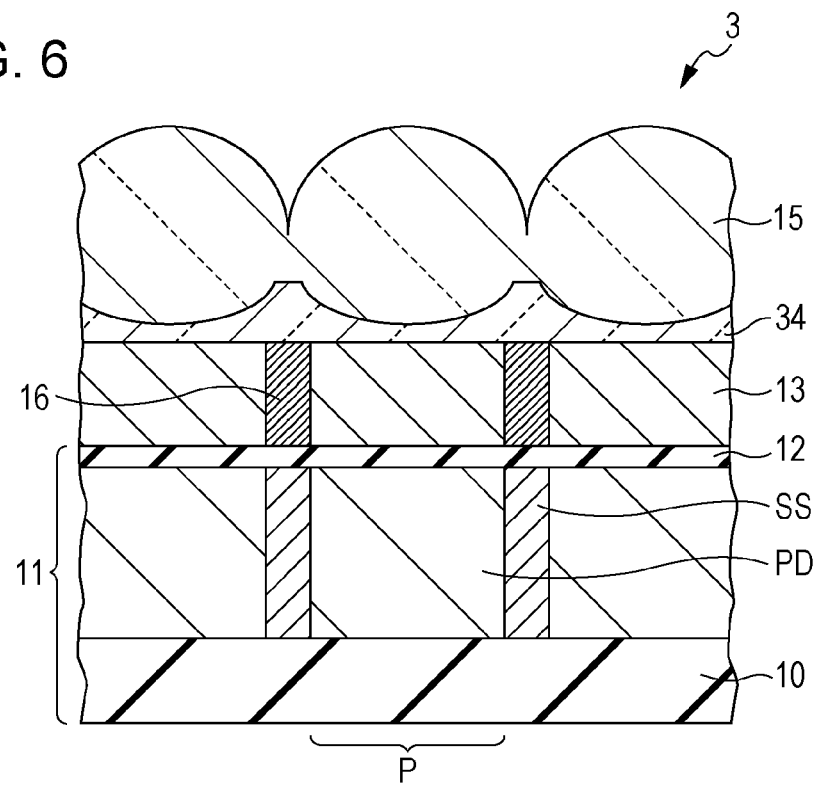
FIG. 6 is a cross-sectional view of the solid-state imaging device according to a second embodiment of the present disclosure.

FIG. 6 is a cross-sectional view of the solid-state imaging device 3. The solid-state imaging device 3 has the in-layer lens 34 formed between the color filter 13 and the micro lens 15.

The in-layer lens 34 is a concave lens having the refractive index greater than that of the micro lens 15. The in-layer lens 34 emits light focused by the micro lens 15 as described below. As a material of the in-layer lens 34, the same material as that of the in-layer lens 14 of FIG. 2 may be used.

Figure 7:
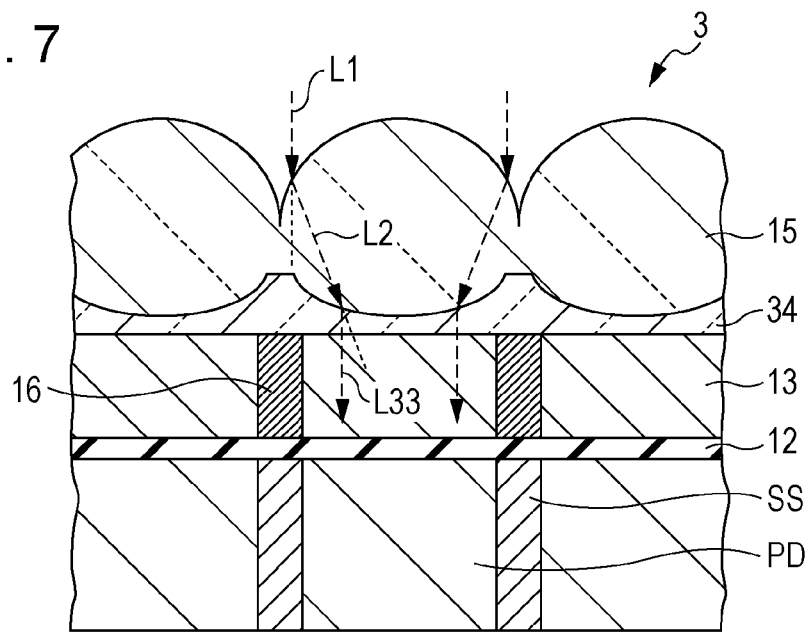
FIG. 7 is a cross-sectional view of the solid-state imaging device according to the second embodiment of the present disclosure.

Light incident to the solid-state imaging device 3 will be described with reference to FIG. 7.

The incident light L1 becomes light L2 refracted to the inside, that is, near the center of the micro lens 15, by the micro lens 15. The light L2 focused by the micro lens 15 is incident to the in-layer lens 34. The light L2 focused by the micro lens 15 becomes light L33 refracted to the outside, that is, an outer peripheral side of the in-layer lens 34, by the in-layer lens 34. That is, the light L2 focused by the micro lens 15 is emitted by the in-layer lens 34.

The light L2 focused by the micro lens 15 is incident to the in-layer lens 34. A method of making the refractive indexes of the in-layer lens 14 and the micro lens 15 different from each other includes a method of changing the material of the lens and changing the bending rates like the first embodiment. Furthermore, there is a method of making the lens diameter of the in-layer lens 34 smaller than that of the micro lens 15. In this case, since it is possible to relatively make the lens diameter of the micro lens 15 greater than that of the in-layer lens 34, the micro lens 15 is able to focus more incident light.

A method of manufacturing the solid-state imaging device 3 will be described by the use of FIGS. 8A to 8E. In addition, since a process of forming the pixel P and a process of forming the color filter 13 are the same as those of the related art, the descriptions thereof will be omitted.

Figure 8A:
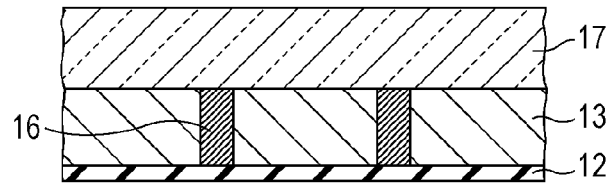
FIGS. 8A to 8E are manufacturing process diagrams of the solid-state imaging device according to the second embodiment of the present disclosure.

Firstly, the in-layer lens material 17 is formed on the color filter 13 (FIG. 8A).

Figure 8B:
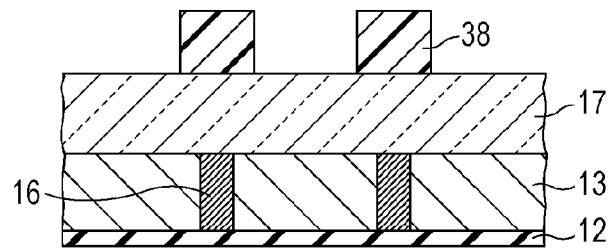

A positive type photoresist 38 is applied onto the in-layer lens material 17 and is patterned in a grid form so as to surround the pixel P (FIG. 8B).

Figure 8C:
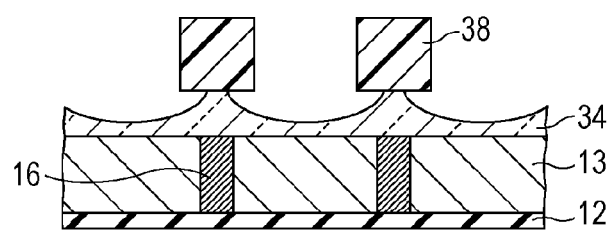

Next, the positive type photoresist 38 is used as a mask to perform isotropic etching, a concave depression is formed in the in-layer lens material 17, and the in-layer lens 34 is formed (FIG. 8C).

Figure 8D:
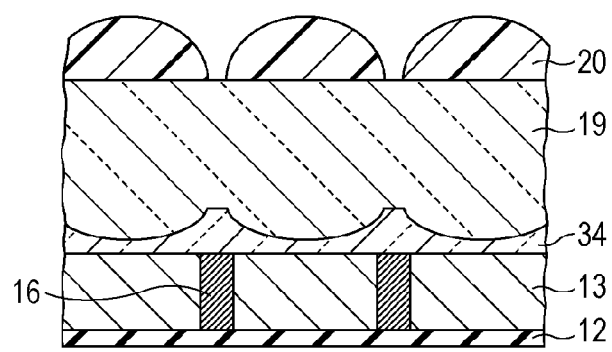

Next, the micro lens material 19 is formed on the in-layer lens 34, and the lens-shaped positive type photoresist 20 is formed by the same process as that of the positive type photoresist 18 (FIG. 8D).

Figure 8E:
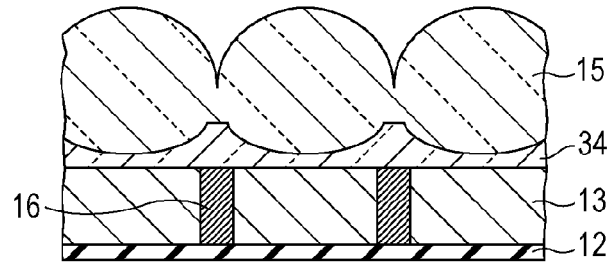

The positive type photoresist 20 is used as the mask, and the lens shape is pattern-transferred to the underlying micro lens material 19 by the use of the dry etching method, thereby forming the micro lens 15. At this time, in the solid-state imaging device 2, in order to remove the gap between the adjacent lenses, the etching is consecutively performed (FIG. 8E).

The in-layer lens 34 is hard to reduce the gap of the lens so as to perform the isotropic etching. Meanwhile, the micro lens 15 is able to reduce the gap between the adjacent lenses by continuing the etching. The lens diameter of the micro lens 15 may be greater than that of the in-layer lens 34 by manufacturing the lens by the method mentioned above.

As mentioned above, according to the solid-state imaging device 3 according to the second embodiment, it is possible to obtain the same effect as that of the first embodiment even if the in-layer lens 34 is a concave lens.

Third Embodiment

Next, a solid-state imaging device 4 according to a third embodiment of the present disclosure will be described by the use of FIGS. 9 and 10. The solid-state imaging device 4 according to the present embodiment is different from the solid-state imaging device 1 shown in FIG. 2 in that an in-layer lens 44 is constituted by lenses of n (n 2) layer. Since other components are the same as those of the solid-state imaging device 1, the same reference numerals are denoted and the repeated descriptions will be omitted.

Figure 9:
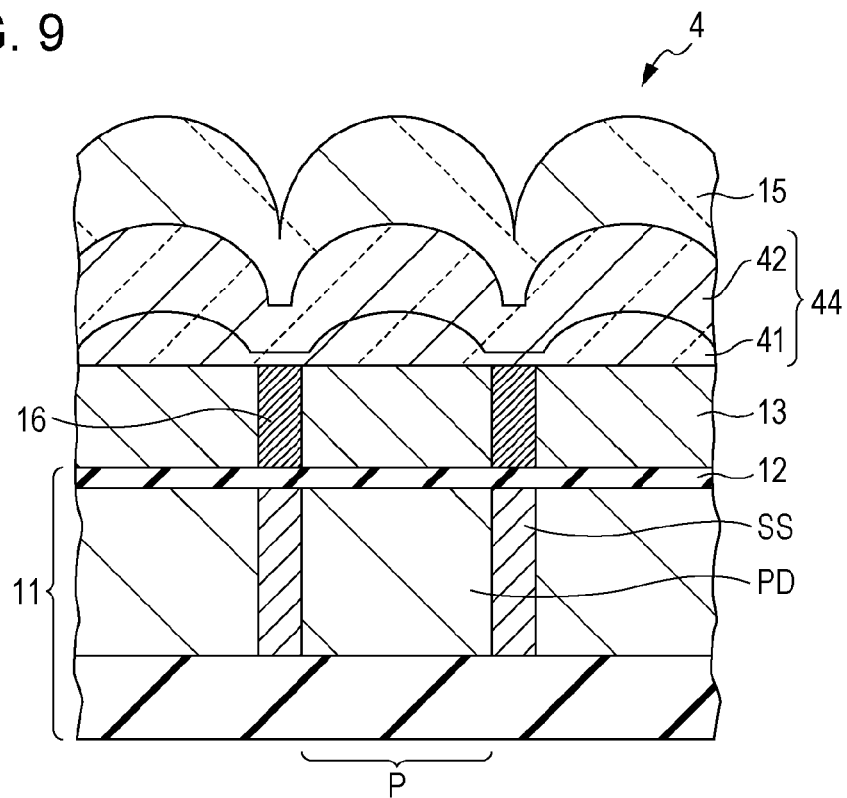
FIG. 9 is a cross-sectional view of the solid-state imaging device according to a third embodiment of the present disclosure.
Figure 10:
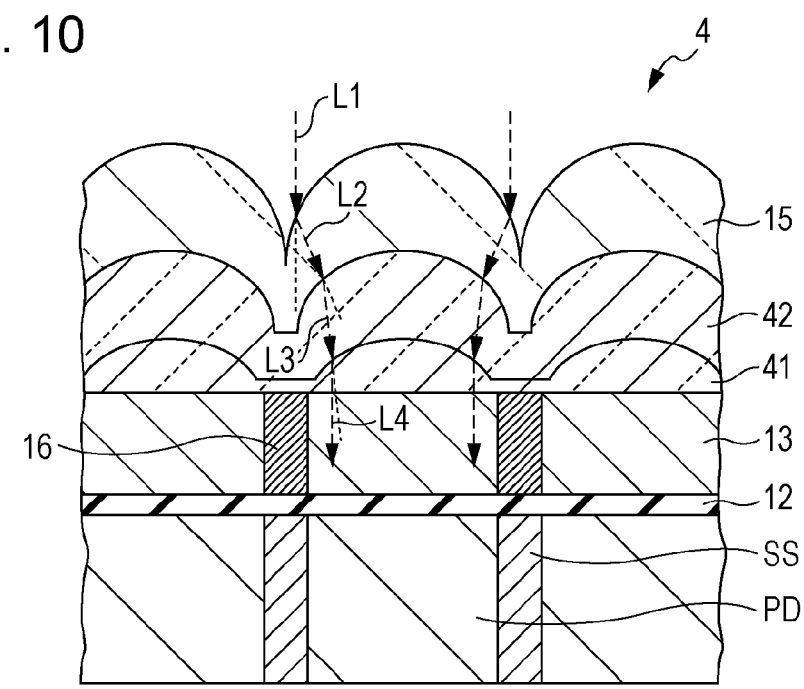
FIG. 10 is a cross-sectional view of the solid-state imaging device according to the third embodiment of the present disclosure.

FIG. 9 is a cross-sectional view of the solid-state imaging device 4. The solid-state imaging device 4 has an in-layer lens 44 that is formed between the color filter 13 and the micro lens 15. The in-layer lens 44 is constituted by multiple layers (n layers (n is an integer equal to or greater than 2). The closer to the color filter 13, the smaller the refractive index of the in-layer lens.

Hereinafter, a case of n=2 will be described. The lenses are referred to as a first in-layer lens 41, and a second in-layer lens 42 in a sequence in which the in-layer lens of n-th layer is formed in the layer close to the color filter 13.

The first in-layer lens 41 is a convex lens having refractive index smaller than those of the micro lens 15 and the second in-layer lens 42. The first in-layer lens 41 further emits light focused by the micro lens 15 and emitted by the second in-layer lens 42 as described below.

The second in-layer lens 42 is a convex lens having refractive index smaller than that of the micro lens 15 and greater than that of the first in-layer lens 41. The second in-layer lens 42 emits light focused by the micro lens and causes the same to be incident to the first in-layer lens 41.

The materials of the first and second in-layer lenses 41 and 42 may be used by the same material as that of the in-layer lens material 17 of FIG. 2. The method of making the refractive indexes of the first in-layer lens 41 and the second in-layer lens 42 different from each other includes a method of changing the material and the refractive index of the lens, a method of making the lens diameter of the first in-layer lens 41 smaller than those of the micro lens 15 and the second in-layer lens 42 or the like.

Light incident to the solid-state imaging device 4 will be described by the use of FIG. 10.

The incident light L1 becomes light L2 refracted to the inside, that is, from the center of the micro lens 15, by the micro lens 15. The light L2 is incident to the second in-layer lens 42. The light L2 becomes light L3 refracted to the outside, that is, to the outer peripheral side of the second in-layer lens 42, by the second in-layer lens 42. That is, the light L2 is emitted by the second in-layer lens 42.

The light L2 is incident to the first in-layer lens 41. The light L2 becomes light L4 further refracted to the outside, that is, to the outer peripheral side of the first in-layer lens 41, by the first in-layer lens 41. That is, the light L3 is emitted by the first in-layer lens 41.

Since the light L2 focused by the micro lens 15 is incident to the second in-layer lens 42, the lens diameter of the second in-layer lens 42 may be smaller than that of the micro lens 15. Furthermore, since the first in-layer lens 41 further emits light emitted by the second in-layer lens 42, the lens diameter of the first in-layer lens 41 may be smaller than that of the second in-layer lens 42.

The in-layer lens 44 may be made by forming the in-layer lens 14 multiple times, that is, by repeatedly performing the processes of FIGS. 4A to 4C by n times. Thus, the method of manufacturing the solid-state imaging device 4 will be omitted.

As mentioned above, according to the solid-state imaging device 4 according to the third embodiment, it is possible to obtain the same effect as that of the first embodiment even if the in-layer lens 44 is formed by the in-layer lenses of n-th layer.

In addition, in the present embodiment, both of the first in-layer lens 41 and the second in-layer lens 42 are convex lenses. However, one of them may be a concave lens, and both of them may be concave lenses. When an n-th layer is a concave lens, the refractive index of an n-th in-layer lens is set to be greater than that of an n+1-th layer lens (n>1).

Fourth Embodiment

Next, a solid-state imaging device 5 according to a fourth embodiment of the present disclosure will be described by the use of FIGS. 11 to 13B. The solid-state imaging device 5 is an apparatus in which the solid-state imaging device 1 of FIG. 2 is subjected to a pupil correction. Since other points are the same as those of the solid-state imaging device 1, the same reference numerals are denoted, and the repeated descriptions will be omitted.

More vertical incident lights are incident to a center pixel of the substrate 11 of the solid-state imaging device 5, and more oblique incident lights are incident to the peripheral pixels. Thus, when the pixel P, the color filter 13, the micro lens 15, and the in-layer lens 14 provided around the substrate are placed on a straight line, sensitivity to the oblique incident light declines.

Figure 11:
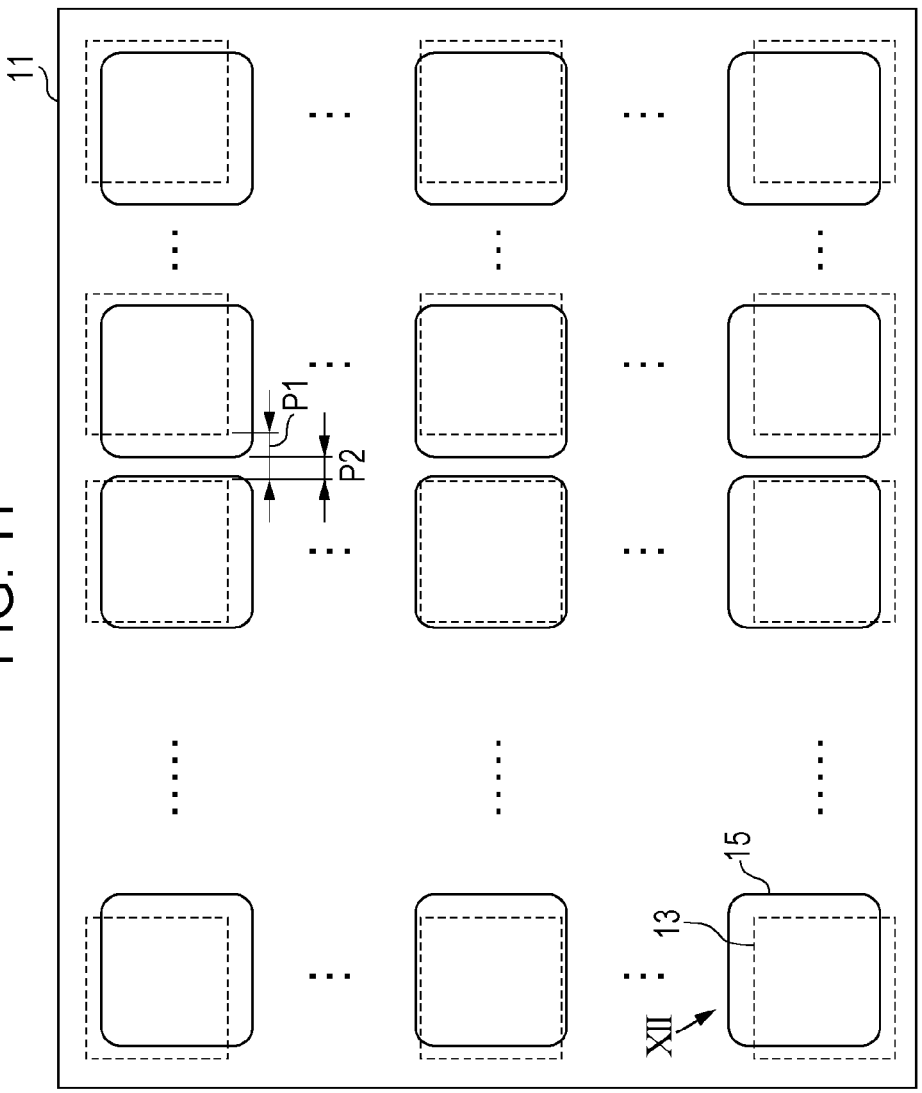
FIG. 11 is a diagram showing the solid-state imaging device according to a fourth embodiment of the present disclosure.

Thus, in the present embodiment, as shown in FIG. 11, a pitch P2, by which the micro lens 15 and the in-layer lens 14 are placed, is smaller than a pitch P1 by which the color filter 13 is placed. Although it is not shown, the pitch placing the pixel P is the same as that of the color filter 13.

Figure 12:
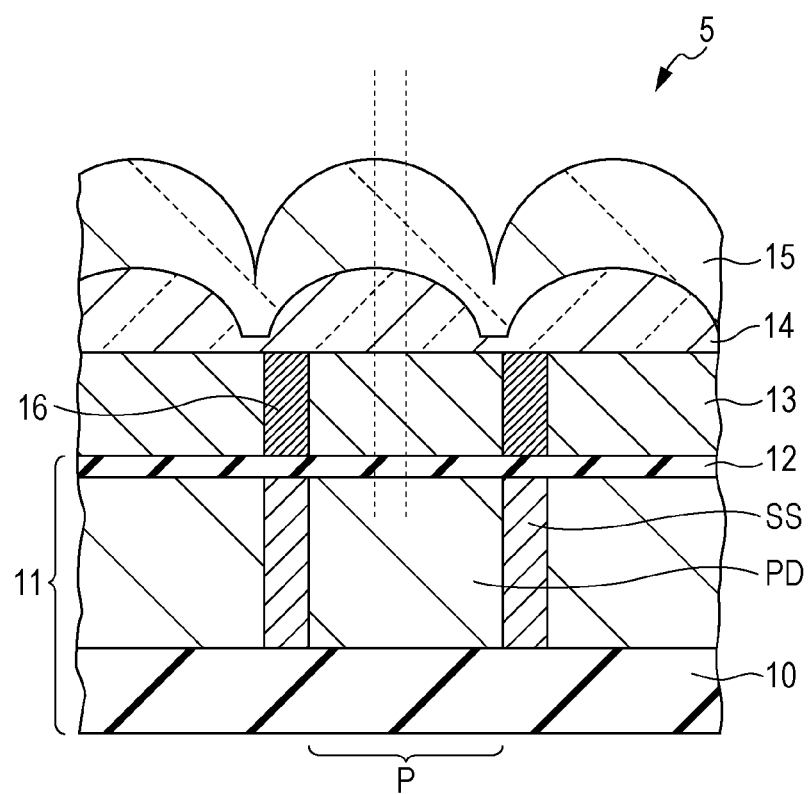
FIG. 12 is a cross-sectional view of the solid-state imaging device according to the fourth embodiment of the present disclosure.

FIG. 12 shows a cross-sectional view of peripheral pixels (XII of FIG. 11) of the substrate 11. The centers of the micro lens 15 and the in-layer lens 14 are on the same line. The centers of each hue filter component of the pixel P and the color filter 13 are on the same line. The center of the micro lens 15 is placed so as to be shifted in a center direction of the substrate 11 to the center of the hue filter component of the corresponding color filter 13.

Figure 13A:
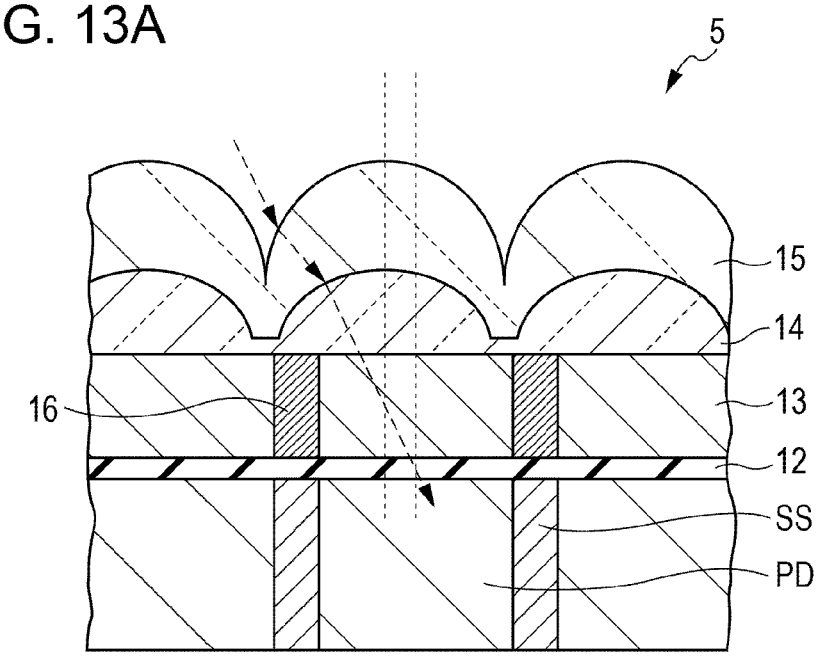
FIGS. 13A and 13B are cross-sectional views of the solid-state imaging device according to the fourth embodiment of the present disclosure.
Figure 13B:
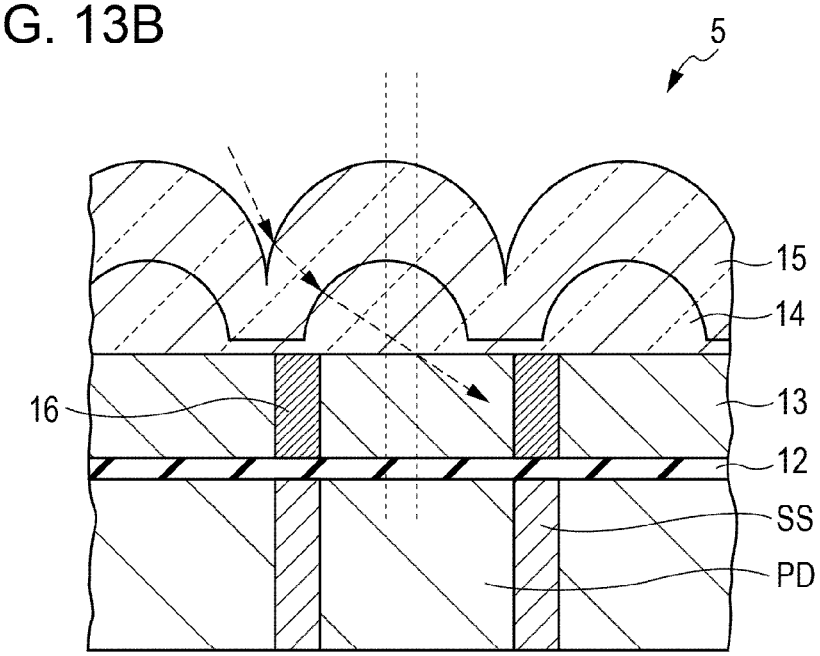

Light incident to the solid-state imaging device 5 will be described by the use of FIGS. 13A and 13B. FIG. 13A is a diagram showing the solid-state imaging device 5 according to the present embodiment. FIG. 13B is a diagram showing an example in a case where the refractive index of the in-layer lens is set to be greater than that of the micro lens for comparison.

As shown in FIG. 13A, the light L1 incident to the solid-state imaging device 5 is focused by the micro lens 15, then is emitted by the in-layer lens 14, is transmitted through the color filter 13, and is incident to the photoelectric conversion element PD.

Meanwhile, as shown in FIG. 13B, when the refractive index of the in-layer lens is greater than that of the micro lens, the light L1 incident to the solid-state imaging device 5 is focused by the micro lens, and then is further focused by the in-layer lens. Light further focused by the in-layer lens is blocked by a light shielding film, and does not reach the photoelectric conversion element PD.

In this manner, if the refractive index of the in-layer lens is greater than that of the micro lens, when placing the centers of the micro lens and the in-layer lens on the same line and performing the pupil correction, the oblique incident light is blocked by the light shielding film. In order to avoid this, it is necessary to shift the centers of the micro lens and the in-layer lens, whereby costs of design and manufacturing are increased.

In the solid-state imaging device 5 according to the present embodiment, since the refractive index of the in-layer lens 14 is smaller than that of the micro lens 15, even when placing the centers of the micro lens 15 and the in-layer lens 14 on the same line and performing the pupil correction, the oblique incident light is hardly blocked by the light shielding film 16. Thus, there is no necessity to shift the centers of the micro lens 15 and the in-layer lens 14, and it is possible to suppress an increase in cost of design and manufacturing.

As described above, according to the solid-state imaging device 5 according to the fourth embodiment, the same effect as that of the first embodiment can be obtained, and even when the lenses are present in a plurality of layers, it is possible to perform the pupil correction on the solid-state imaging device 5 without increasing the costs of design and manufacturing.

In addition, in the embodiments mentioned above, the pupil correction is performed by placing the centers of the micro lens 15 and the in-layer lens 14 on the same line, but the centers of the micro lens 15 and the in-layer lens 14 may be shifted. Furthermore, the color filter 13 may be placed so that the center thereof is shifted in the center direction of the substrate 11.

Figure 14:
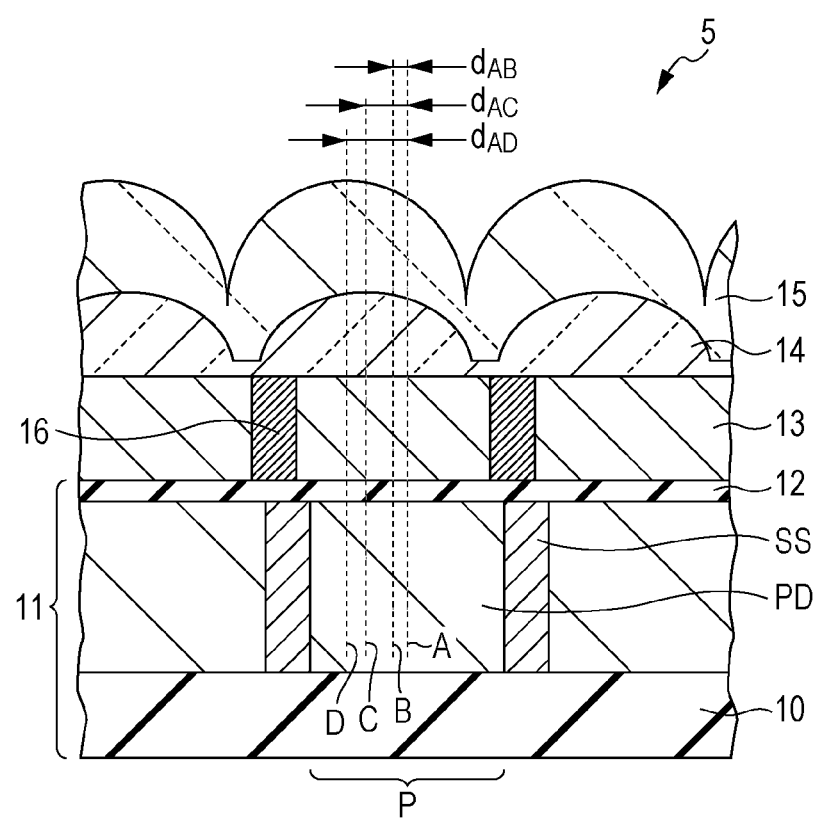
FIG. 14 is a cross-sectional view of the solid-state imaging device according to the fourth embodiment of the present disclosure.

FIG. 14 shows a solid-state imaging device in which the centers of the micro lens 15, the in-layer lens 14, and the color filter 13 are placed so as to be shifted in the center direction of the substrate 11, respectively. In FIG. 14, a distance (a shift amount), by which a center D of the micro lens 15 is shifted to a center A of the pixel P, is $d_{AD}$, and a distance (a shift amount), by which a center C of the in-layer lens 14 is shifted to the center A of the pixel P, is $d_{AC}$. Furthermore, a distance (a shift amount), by which a center B of the color filter 13 is shifted to the center A of the pixel P, is $d_{AB}$. In this case, the centers of the micro lens 15, the in-layer lens 14, and the color filter 13 are placed so as to be shifted in the center direction of the substrate 11, respectively, so that a relationship of $d_{AD} \geq d_{AC} \geq d_{AB}$ is obtained.

Figure 5:
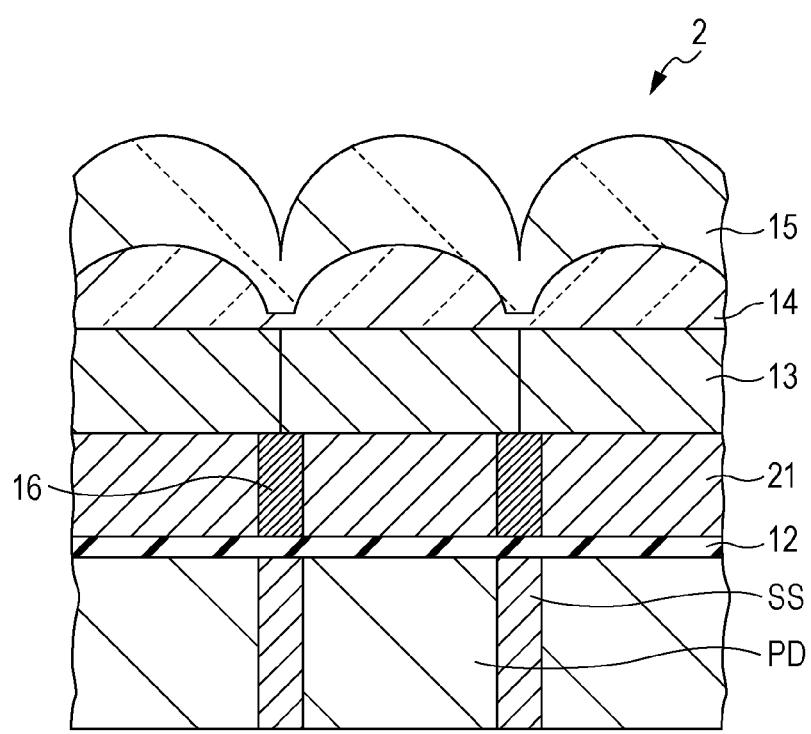
FIG. 5 is a cross-sectional view of the solid-state imaging device according to a modified example of the first embodiment of the present disclosure.

Furthermore, as shown in FIG. 5, in a case where the color filter 13 and the light shielding film 16 are formed on the different layers, the light shielding film 16 and the planarization film 21 may also be placed so as to be shifted in the center direction of the substrate. In this case, the shift amounts d of the light shielding film 16 and the planarization film 21 may be set so that a relationship $d_{AB} \geq d$ is obtained.

In addition, in the embodiments mentioned above, a case has been described where the pupil correction is performed on the solid-state imaging device 1 according to the first embodiment, but the pupil correction may be similarly performed on the solid-state imaging devices 2 to 4 according to the modified example 1, and the second and third embodiments.

Fifth Embodiment

Figure 15:
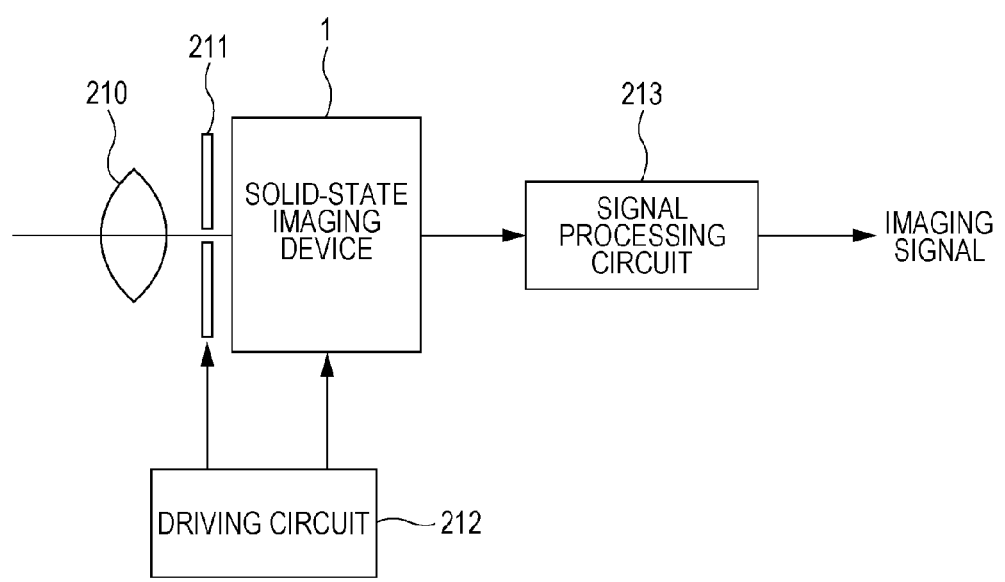
FIG. 15 is a diagram showing an electronic apparatus according to a fifth embodiment of the present disclosure.

Next, in a fifth embodiment of the present disclosure, an application example of the solid-state imaging device 1 will be described. FIG. 15 shows an example in which the solid-state imaging device 1 is applied to an electronic apparatus 400. The electronic apparatus 400 includes, for example, digital cameras, cameras of mobile phones or the like, scanners, monitoring cameras or the like, but a case will be described herein where the electronic apparatus 400 is a digital camera.

The electronic apparatus 400 according to the present embodiment has the solid-state imaging device 1, an optical lens 210, a shutter apparatus 211, a driving circuit 212, and a signal processing circuit 213.

The optical lens 210 performs an image formation of an image light (incident light) from a subject on an imaging surface of the solid-state imaging device 1. As a result, a signal charge is accumulated in the solid-state imaging device 1 for a certain period of time.

The shutter apparatus 211 controls a light irradiation time interval and a light shielding time interval to the solid-state imaging device 1. The driving circuit 212 supplies a driving signal that controls a transmission operation of the solid-state imaging device 1 and a shutter operation of the shutter apparatus 211.

The solid-state imaging device 1 outputs the signal charge accumulated in the photoelectric conversion element PD as the electric signal based on the driving signal.

The signal processing circuit 213 performs various signal processes. The signal processing circuit 213 performs the signal processing on the electric signal output from the solid-state imaging device 1, generates the image signal, and outputs the same to a memory medium such as a memory (not shown), a monitor or the like.

As described above, since the electronic apparatus 400 according to the present embodiment is equipped with the solid-state imaging device 1 according to the first embodiment, the image quality degradation can be suppressed, and the image quality of the image signal can be improved.

Herein, a case has been described where the electronic apparatus 400 is equipped with the solid-state imaging device 1 according to the first embodiment, but the electronic apparatus 400 may be equipped with the solid-state imaging devices 2 to 5 according to the modified example 1, and the second to fourth embodiments.

In addition, in the respective embodiments mentioned above, the back irradiation type solid-state imaging device of a CCD type has been described as an example of the solid-state imaging device. However, it is needless to say that the present disclosure can also be applied to a CMOS type solid-state imaging device and a surface irradiation type solid-state imaging device. Generally, in the back irradiation type solid-state imaging device, a distance between the photoelectric conversion element PD and the color filter 13 is shorter than that of the surface irradiation type. Thus, the focal position of the lens easily exists in the color filter 13, whereby the image quality degradation is easily generated. Thus, a greater effect can be obtained when applying the solid-state imaging device 1 to 5 to the back irradiation type solid-state imaging device.

Furthermore, in the respective embodiments, the color filter 13 includes the pigment or dye particles, but the pigment has the particles greater than those of the dye. For that reason, when the color filter 13 includes the pigment particles, the degradation of the image quality is easily generated. Thus, greater effect can be obtained when applying the solid-state imaging devices 1 to 5 in a case where the color filter 13 includes the pigment.

Finally, the description of the respective embodiments mentioned above is an example of the present disclosure, and the present disclosure is not limited to the embodiments mentioned above. For this reason, in addition to the respective embodiments mentioned above, the present disclosure is able to be variously modified depending on design requirements or the like insofar as they are within the scope of the technical ideas according to the present disclosure.

The present disclosure contains subject matter related to that disclosed in Japanese Priority Patent Application JP 2011-064301 filed in the Japan Patent Office on Mar. 23, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising: a pixel that has a photoelectric conversion section which converts incident light into an electric signal; a color filter which is formed corresponding to the pixel; a micro lens which focuses the incident light to the photoelectric conversion section via the color filter; and an in-layer lens which is formed between the color filter and the micro lens and has a refractive index smaller than that of the micro lens, wherein the in-layer lens has a lens diameter smaller than that of the micro lens and a length of the lens diameter is based on a desired refractive index.

2. The solid-state imaging device according to claim 1, wherein both of the micro lens and the in-layer lens are a convex lens.

3. The solid-state imaging device according to claim 1, wherein the in-layer lens includes a lens of multi-layers and has the smallest refractive index by the lens of the layer close to the color filter.

4. The solid-state imaging device according to claim 1, wherein the pixel, the micro lens, and the in-layer lens are formed on a substrate, and centers of the micro lens and the in-layer lens provided on a periphery of substrate are placed so as to be shifted to a center of the corresponding pixel in a center direction of the substrate.

5. The solid-state imaging device according to claim 4, wherein an amount, by which the center of the in-layer lens is shifted to the center of the pixel, is smaller than an amount by which the center of the micro lens is shifted.

6. A solid-state imaging device comprising: a pixel that has a photoelectric conversion section which converts incident light into an electric signal; a color filter which is formed corresponding to the pixel; a micro lens which focuses the incident light to the photoelectric conversion section via the color filter; and an in-layer lens which is formed between the color filter and the micro lens and has a refractive index greater than that of the micro lens, wherein the in-layer lens has a lens diameter smaller than that of the micro lens and a length of the lens diameter is based on a desired refractive index.

7. A solid-state imaging device comprising: a pixel that has a photoelectric conversion section which converts incident light into an electric signal; a color filter which is formed corresponding to the pixel; a micro lens which focuses the incident light to the photoelectric conversion section via the color filter; and an in-layer lens of n-th layer (n>1) which is formed between the color filter and the micro lens, emits the incident light focused by the micro lens, and causes the incident light to be incident to the photoelectric conversion section, wherein the micro lens is a convex lens and the in-layer lens is a concave lens and wherein the in-layer lens includes a lens of multi-layers and the lens of the layer closest to the color filter has the greatest refractive index.

8. A solid-state imaging device comprising: a pixel that has a photoelectric conversion section which converts incident light into an electric signal; a color filter which is formed corresponding to the pixel; a micro lens which focuses the incident light to the photoelectric conversion section via the color filter; and an in-layer lens which is formed between the color filter and the micro lens and emits the incident light focused by the micro lens, wherein the in-layer lens has a lens diameter smaller than that of the micro lens and a length of the lens diameter is based on a desired refractive index.

9. A method of manufacturing a solid-state imaging device comprising: forming a pixel which has a photoelectric conversion section which converts incident light into an electric signal; forming a color filter which is formed corresponding to the pixel; forming a micro lens which focuses the incident light to the photoelectric conversion section via the color filter; and forming an in-layer lens of an n-th layer (n>1) which is formed between the color filter and the micro lens and has a refractive index smaller than that of the micro lens, wherein the micro lens is a convex lens and the in-layer lens is a concave lens and wherein the in-layer lens includes a lens of multi-layers and the lens of the layer closest to the color filter has the greatest refractive index.

10. An electronic apparatus comprising: a solid-state imaging device which includes a pixel that has a photoelectric conversion section which converts incident light into an electric signal; a color filter which is formed corresponding to the pixel; a micro lens which focuses the incident light to the photoelectric conversion section via the color filter; and an in-layer lens of an n-th layer (n>1) which is formed between the color filter and the micro lens and has a refractive index smaller than that of the micro lens; an optical lens which guides the incident light to the photoelectric conversion section; and a signal processing circuit which processes the electric signal, wherein the micro lens is a convex lens and the in-layer lens is a concave lens and wherein the in-layer lens includes a lens of multi-layers and the lens of the layer closest to the color filter has the greatest refractive index.

* * * * *